United States Patent
Dias et al.

(10) Patent No.: US 9,704,811 B1
(45) Date of Patent: Jul. 11, 2017

(54) PERFORATED CONDUCTIVE MATERIAL FOR EMI SHIELDING OF SEMICONDUCTOR DEVICE AND COMPONENTS

(71) Applicant: Intel Corporation, Santa Clara, CA (US)

(72) Inventors: Rajendra C. Dias, Phoenix, AZ (US); Joshua D Heppner, Chandler, AZ (US); Mitul B Modi, Phoenix, AZ (US); Anna M. Prakash, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/978,294

(22) Filed: Dec. 22, 2015

(51) Int. Cl.
*H01L 23/552* (2006.01)
*H01L 23/495* (2006.01)
*H01L 23/31* (2006.01)
*H01L 21/48* (2006.01)
*H01L 21/56* (2006.01)
*H01L 21/78* (2006.01)

(52) U.S. Cl.
CPC ........ *H01L 23/552* (2013.01); *H01L 21/4825* (2013.01); *H01L 21/565* (2013.01); *H01L 21/78* (2013.01); *H01L 23/3114* (2013.01); *H01L 23/49524* (2013.01)

(58) Field of Classification Search
CPC ............. H01L 23/481; H01L 21/76898; H01L 23/49816; H01L 23/3171; H01L 21/486; H01L 23/49838; H01L 23/49827; H01L 21/565; H01L 21/4853; H01L 23/552; H01L 21/78; H01L 23/49524; H01L 23/3114; H01L 21/4825
See application file for complete search history.

(56) References Cited

U.S. PATENT DOCUMENTS

| 4,177,480 | A | 12/1979 | Hintzmann et al. |
| 5,166,772 | A | 11/1992 | Soldner et al. |
| 8,362,597 | B1 * | 1/2013 | Foster .................. H01L 21/56 257/659 |
| 8,872,312 | B2 * | 10/2014 | Wang ................ H01L 23/3128 257/421 |

(Continued)

FOREIGN PATENT DOCUMENTS

JP   2012074607 A   4/2012

OTHER PUBLICATIONS

"International Application Serial No. PCT/US2016/063300, International Search Report mailed Feb. 20, 2017", 3 pgs.

(Continued)

*Primary Examiner* — Thanh Y Tran
(74) *Attorney, Agent, or Firm* — Schwegman Lundberg & Woessner, P.A.

(57) ABSTRACT

An electric device and method of fabrication of that electric device is disclosed. The electric device includes one or more electrical devices attached to a substrate. The electric device further includes one or more grounding pads attached to the substrate. The electric device further includes a perforated conductive material placed on the substrate. The electric device further includes a molding compound deposited to cover the perforated conductive material, the one or more devices, and the one or more grounding pads.

20 Claims, 12 Drawing Sheets

(56) References Cited

U.S. PATENT DOCUMENTS

| | | | |
|---|---|---|---|
| 9,070,793 B2* | 6/2015 | Liao | H01L 23/3121 |
| 2003/0223213 A1 | 12/2003 | Daoud et al. | |
| 2010/0140759 A1* | 6/2010 | Pagaila | H01L 21/565 |
| | | | 257/660 |
| 2012/0321111 A1 | 12/2012 | Lillelund | |
| 2014/0291820 A1* | 10/2014 | Pagaila | H01L 23/552 |
| | | | 257/659 |
| 2015/0173258 A1* | 6/2015 | Chen | H05K 13/046 |
| | | | 361/753 |
| 2016/0172309 A1* | 6/2016 | Gong | H01L 24/97 |
| | | | 257/659 |

OTHER PUBLICATIONS

"International Application Serial No. PCT/US2016/063300, Written Opinion mailed Feb. 20, 2017", 7 pgs.

* cited by examiner

PERFORATED CONDUCTIVE MATERIAL FOR EMI SHIELDING OF SEMICONDUCTOR DEVICE AND COMPONENTS

TECHNICAL FIELD

Embodiments described herein generally relate to semiconductor devices and components.

BACKGROUND

Electronic devices have grown increasingly small and power efficient. As the size of components have shrunk, the components sensitivity to electromagnetic interference (EMI) has increased. As such, the methods used to shield electrical components from EMI have to be used in the new devices.

Currently, EMI shielding is provided by use of a physical vapor deposition (PVD) sputtering process. Using PVD coats the surface of a mold layer with a conductive material. However, this sputtering process has many disadvantages including the costs of the sputtering equipment, the long amount of time to increase the thickness of the deposited conductive material layer, the complexity of the process, the difficulty of cleaning the mold surface prior to the sputtering process to improve adhesion, and so on. A better EMI shielding method is desirable.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In some example embodiments, one or more devices are attached to a substrate. In some example embodiments, the substrate is an organic substrate. The one or more devices include processors, memory, or other devise based on semiconductor technology. Each device is sufficiently spaced from each other to allow the substrate to cut to create a plurality of system-in-a-packages (SiPs).

In some example embodiments, one or more grounding pads are also attached to the substrate. Grounding pads are used to connect materials to the substrate. In some example embodiments, a perforated conductive material is then placed over the one or more devices. In some example embodiments, the perforated conductive material is a metal tape or ribbon, a perforated metal foil, a porous copper foam material, a metal mesh or weave, metallized plastics or other metallized non-conductive material, and so on.

In some example embodiments, the perforated conductive material is then attached to the substrate via the grounding pads. This allows the perforated conductive material to be durably connected to the substrate.

A molding compound layer is then deposited on the substrate, device, and perforated conductive material such that all three are covered by the molding compound.

The molded strip (including the substrate, one or more devices, perforated conductive material, and molding compound) is the divided into a plurality of single device strips. In this way, a plurality of SiPs with EMI shielding can be created at once, efficiently and relatively inexpensively.

Figure 1:
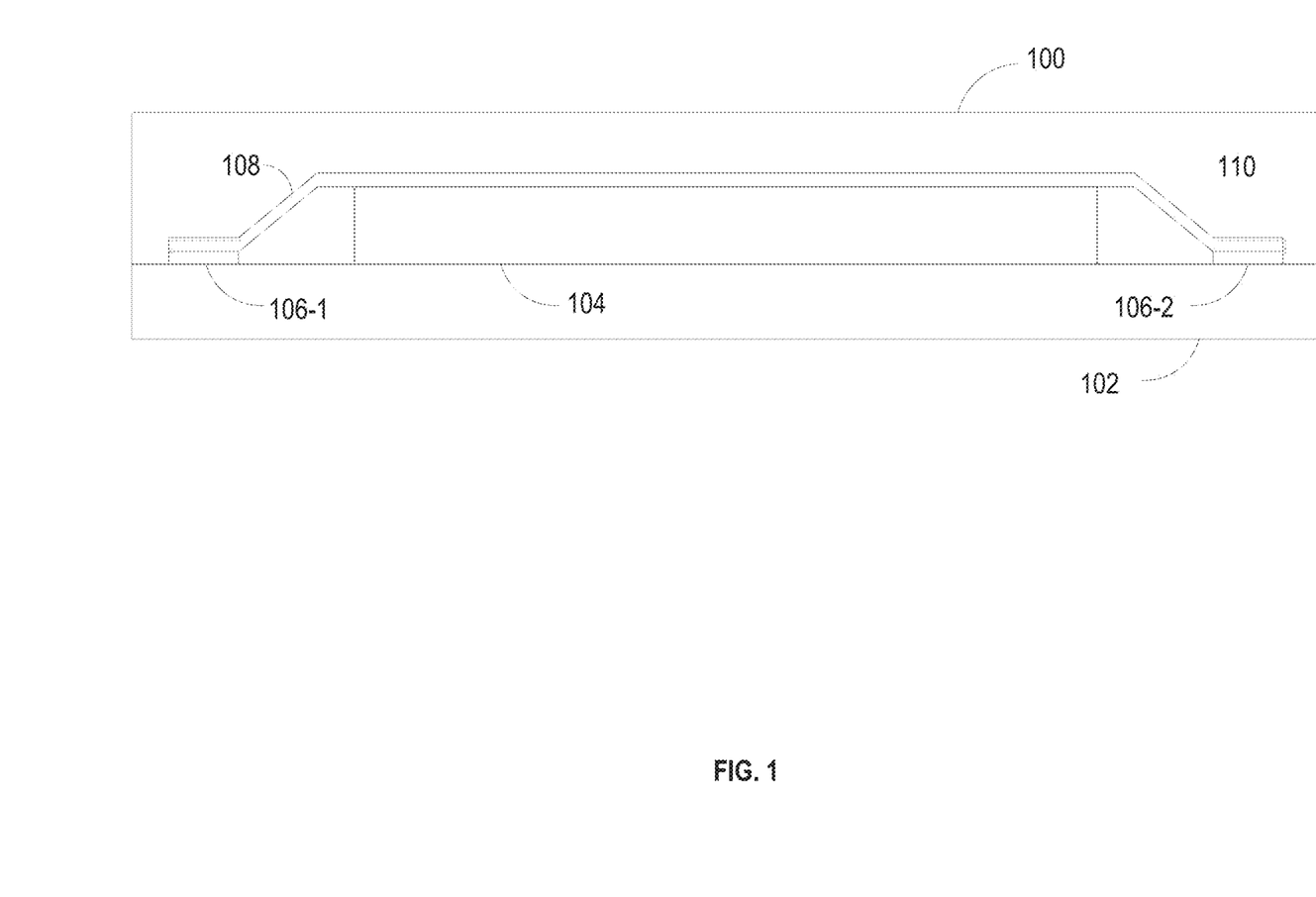
FIG. 1 shows a cross-sectional representation of an electric device.

FIG. 1 shows a cross-sectional representation of an electric device 100. In some example embodiments, the electric device 100 is a system in a package (SiP).

In this example embodiment, the electric device 100 includes a substrate layer 102. In some example embodiments, the substrate layer 102 is any kind of organic substrate that is suitable for use in integrated circuits.

Attached to the substrate 102 is a device 104. In some example embodiments, the device 104 is an integrated circuit such as a processor, memory unit, and so on.

Additionally, one or more grounding pads (106-2 and 106-1) are attached to the substrate layer 102. Each grounding pad allows a perforated conductive material 108 to be connected to the substrate layer 102. In some example embodiments, the perforated conductive material is connected to the grounding pad 106-1 and 106-2 using a solder.

In some example embodiments, the perforated conductive material 108 is also connected to the device 104 by way of a thermal bonding compound that allows the perforated conductive material 108 to dissipate heat from the device 104 more efficiently.

In some example embodiments, a molding compound 110 is used to cover the substrate layer 102, the device 104, and the perforated conductive material 108. In some example embodiments, the molding compound 110 is deposited so as to fill in any holes or gaps in between any of the other components. In addition, the molding compound 110 may fill in the holes in the perforated conductive material 108.

Figure 2A:
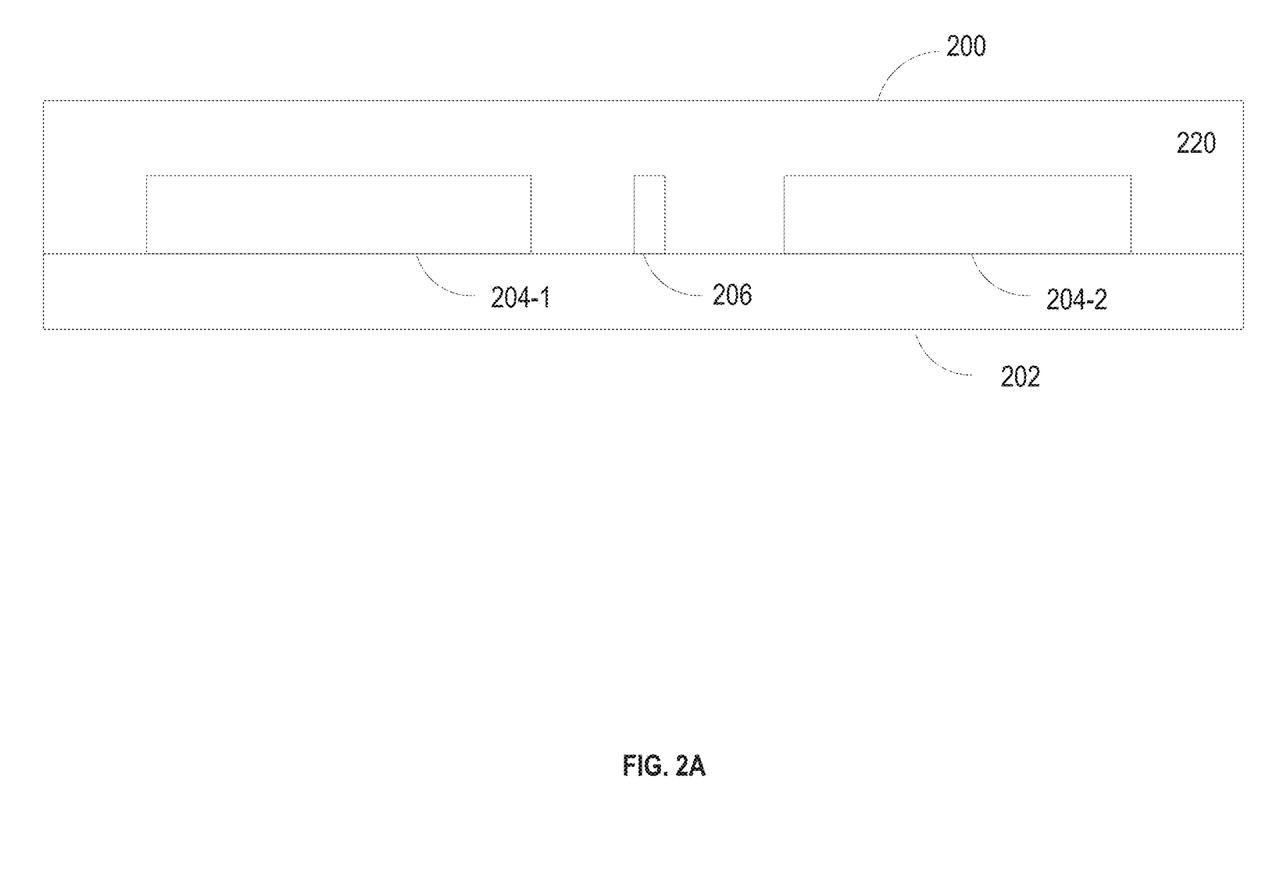
FIG. 2A shows a cross-sectional representation of an electric device.

FIG. 2A shows a cross-sectional representation of an electric device 200. In some example embodiments, the electric device 200 is a system in a package (SiP).

In some example embodiments, the electric device 200 includes a substrate layer 202. As in FIG. 1, the substrate is any kind of organic substrate that is suitable for use in integrated circuits.

The electric device 200 includes two different devices 204-1 and 204-2. These two devices both produce some level of electromagnetic interference. As such, a perforated conductive material or ribbon 206 is placed between the two devices 204-1 and 204-2.

In some example embodiments, the perforated conductive material 206, when laid between two devices in the same electric device 200, serves to reduce EMI within the package itself (as opposed to the covering perforated conductive material 108 shown in FIG. 1, which protects from outside device EMI.).

In some example embodiments, a molding compound 220 is used to cover the substrate layer 202, the two devices 204-1 and 204-2, and the perforated conductive material 206. In some example embodiments, the molding compound 220 is deposited so as to fill in any holes or gaps in between any of the other components. In addition, the molding compound 210 may fill in the holes in the perforated conductive material.

Figure 2B:
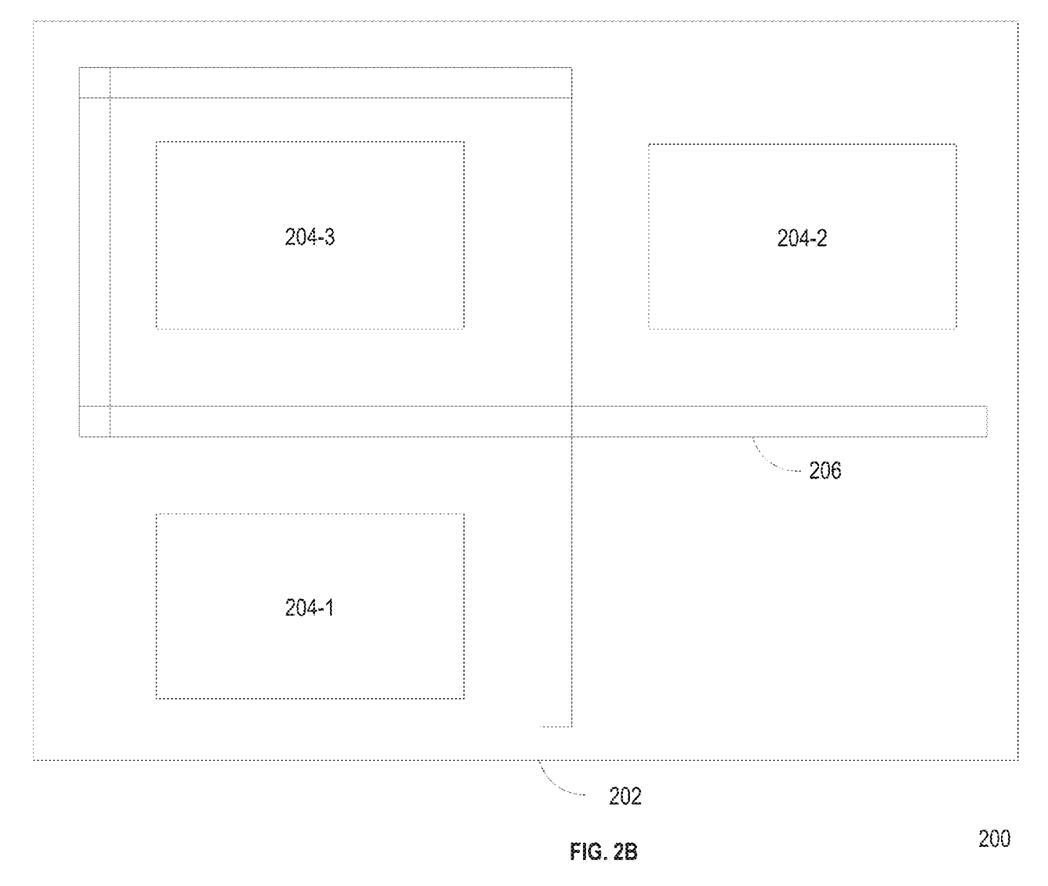
FIG. 2B shows top down representation of an electric device

FIG. 2B shows a top down representation of an electric device 200. In some example embodiments, the electric device 200 is a system in a package (SiP).

FIG. 2B shows the same electric device 200 as, or at least a substantially similar electronic device 200 to, the electric device 200 in FIG. 2A. The electric device 200 includes three devices (204-1 to 204-3) attached to a substrate layer 202.

In this example, the perforated conductive material 206 is shown to wrap around the devices 204-1 to 204-3 such that each device 204-1 to 204-3 receives EMI shielding from interference from the other devices 204-1 to 204-3. The molding compound is not depicted as it would cover the other components.

Figure 3:
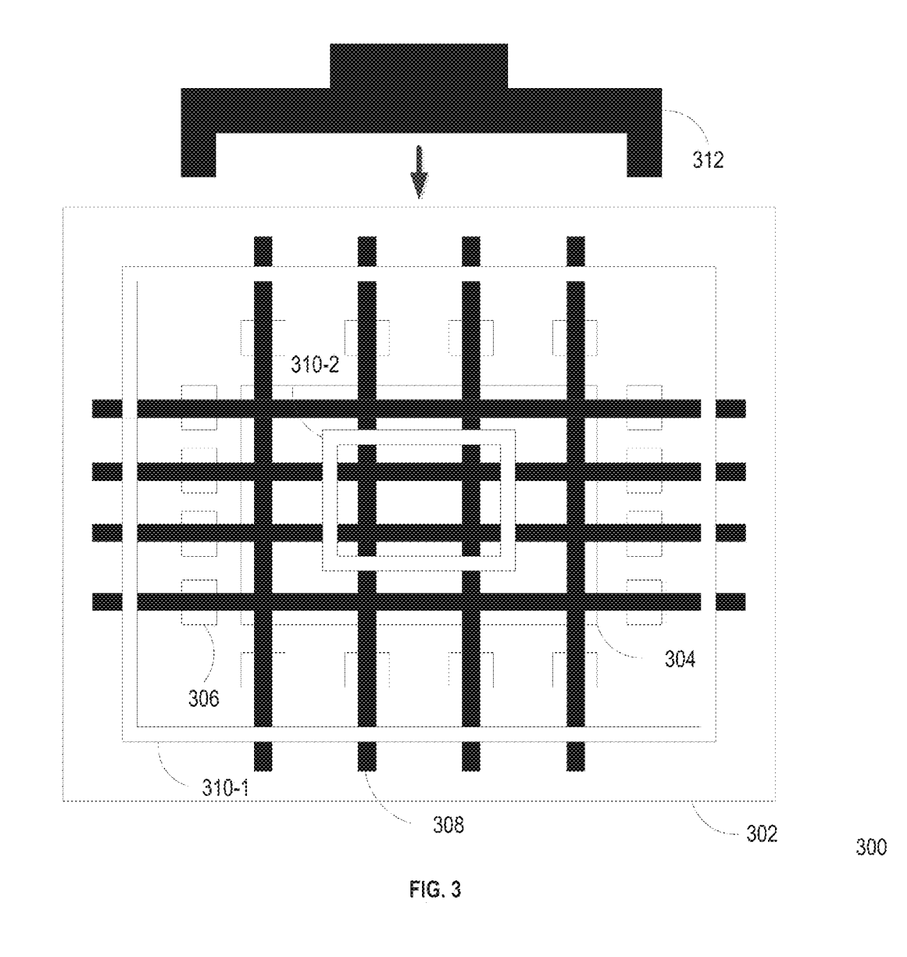
FIG. 3 shows a top down representation of an electric device in some example embodiments.

FIG. 3 shows a top down representation of an electric device 300 in some example embodiments. In some example embodiments, the electric device 300 is a system in a package (SiP).

In some example embodiments, a device 304 is attached to a substrate 302. In some example embodiments, the substrate 302 is an organic substrate. In some example embodiments, the device 304 is an integrated circuit, such as a processor, a memory chip, and so on.

One or more grounding pads (306) are attached to the substrate 302. Each grounding pad 306 is made of conductive material and allows any electrical charge to be grounded (e.g., connected to ground). In some example embodiments, the grounding pads 306 connect to a ground pad on the underside of the substrate 302 and thus penetrate through the substrate 302.

In some example embodiments, a perforated conductive material 308 is laid over the device 304. In this example, the perforated conductive material 308 is a metal tape array. The perforated conductive material 308 servers to shield the device 304 from electrical magnetic interference.

In some example embodiments, the perforated conductive material 308 has a polymer tape (310-1 and 310-2) that holds the perforated conductive material 308 in position.

In some example embodiments, the metal tape array 308 is connected to each of the grounding pads 306 by a bonding tool 312. In some example embodiments, the bonding tool 312 fixes the metal tape array 308 to the grounding pads 306 physically. In other example embodiments, the bonding tool 312 also uses solder or thermal paste to electrically connect the metal tape array 308 to the grounding pads 306.

Figure 4A:
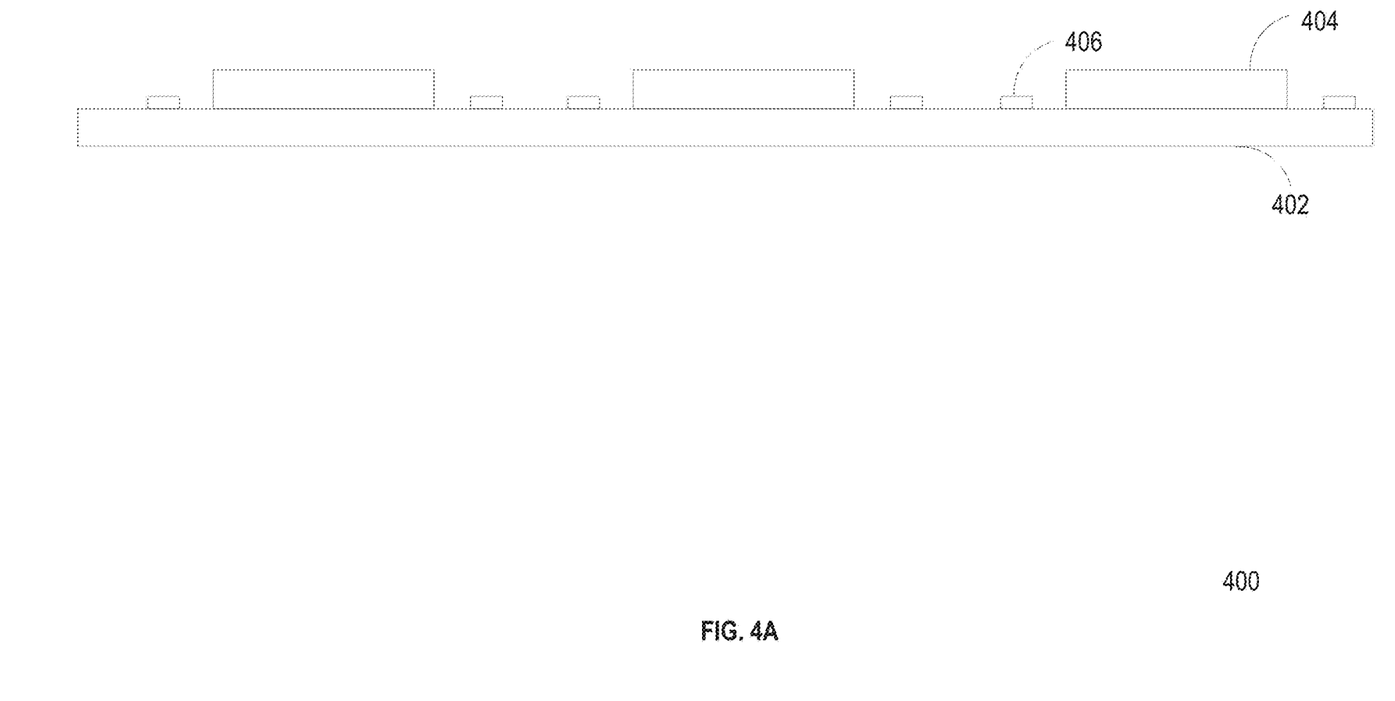
FIGS. 4A-4E show stages in a process for fabrication of an electric device, in accordance with some example embodiments.

FIG. 4A shows a stage in a process for fabrication of an electric device 400, in accordance with some example embodiments. In some example embodiments, the electric device 400 is a system in a package (SiP).

The electric device 400 includes a substrate 402. As noted above, the substrate 402 is an organic substrate. One or more devices 404 are attached to the substrate 402.

In some example embodiments, the electric device 400 includes one or more grounding pads 406. In some example embodiments, the grounding pads 406 are made of a section of conductive material that connects to a ground pad or other ground connection.

In some example embodiments, the devices 404 are mechanically fixed and electrically connected to the substrate 402 using soldering. In some example embodiments, a variety of soldering techniques can be used to attach the devices 404 to the substrate 402. For example, through-hole technology is used to insert component leads in holes or gaps in the substrate 402 (e.g., a printed circuit board) which are then filled with solder.

In other example embodiments, flip chip technology or surface-mount technology (SMT) is used and the device 404 are glued on pads or leads on the surface of the substrate 402.

Figure 4B:
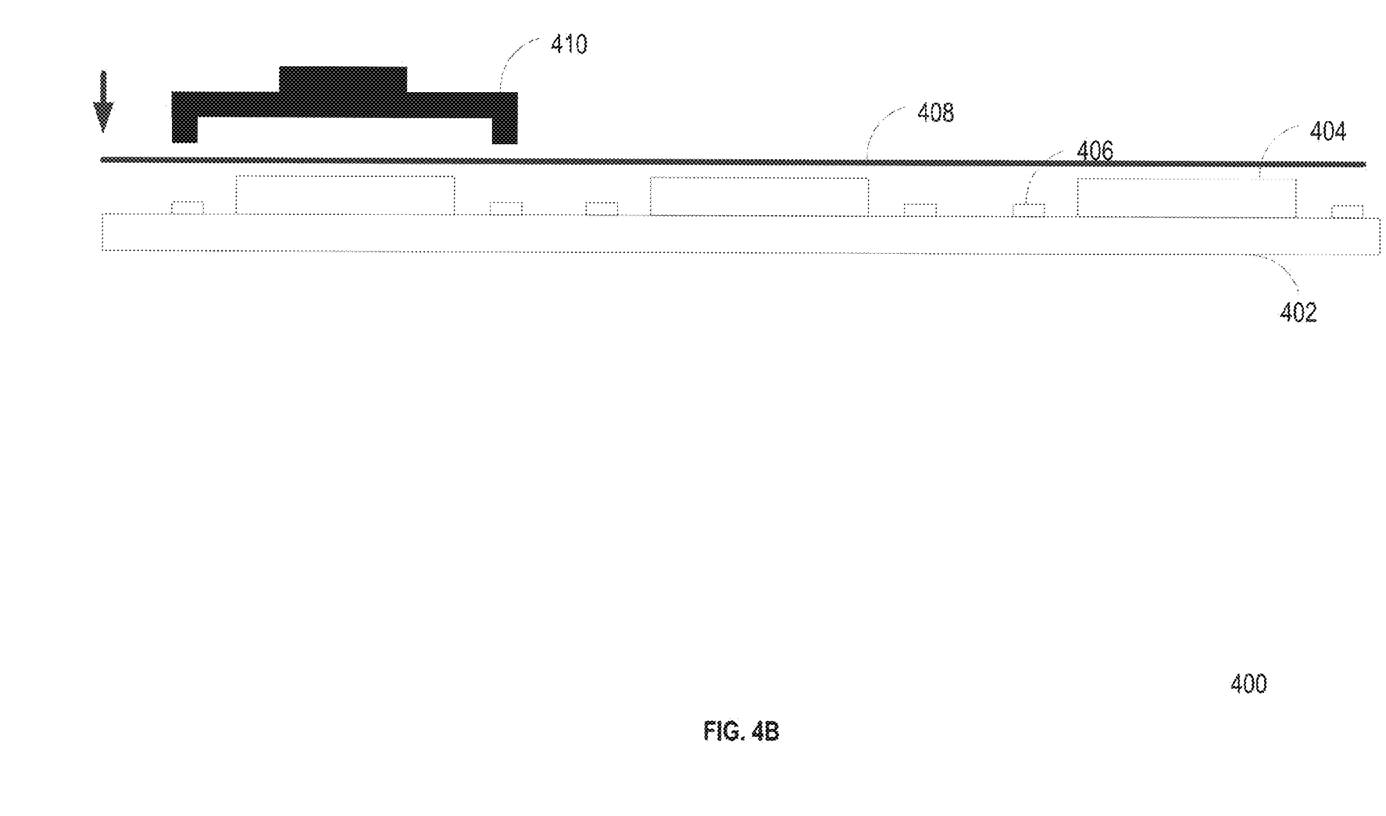

FIG. 4B shows a stage in a process for fabrication of an electric device 400, in accordance with some example embodiments. In some example embodiments, the electric device 400 is a system in a package. FIG. 4B continues the process shown in FIG. 4A.

A perforated conductive material 408 is laid over the devices 404 that are connected to the substrate 402. A bonding tool 410 is then used to connect the perforated conductive material 408 to the one or more grounding pads 406.

In some example embodiments, the perforated conductive material 408 is one of a metal tape or ribbon, a perforated metal foil, a porous copper foam material, a metal mesh or weave, or another appropriate perforated conductive material.

Figure 4C:
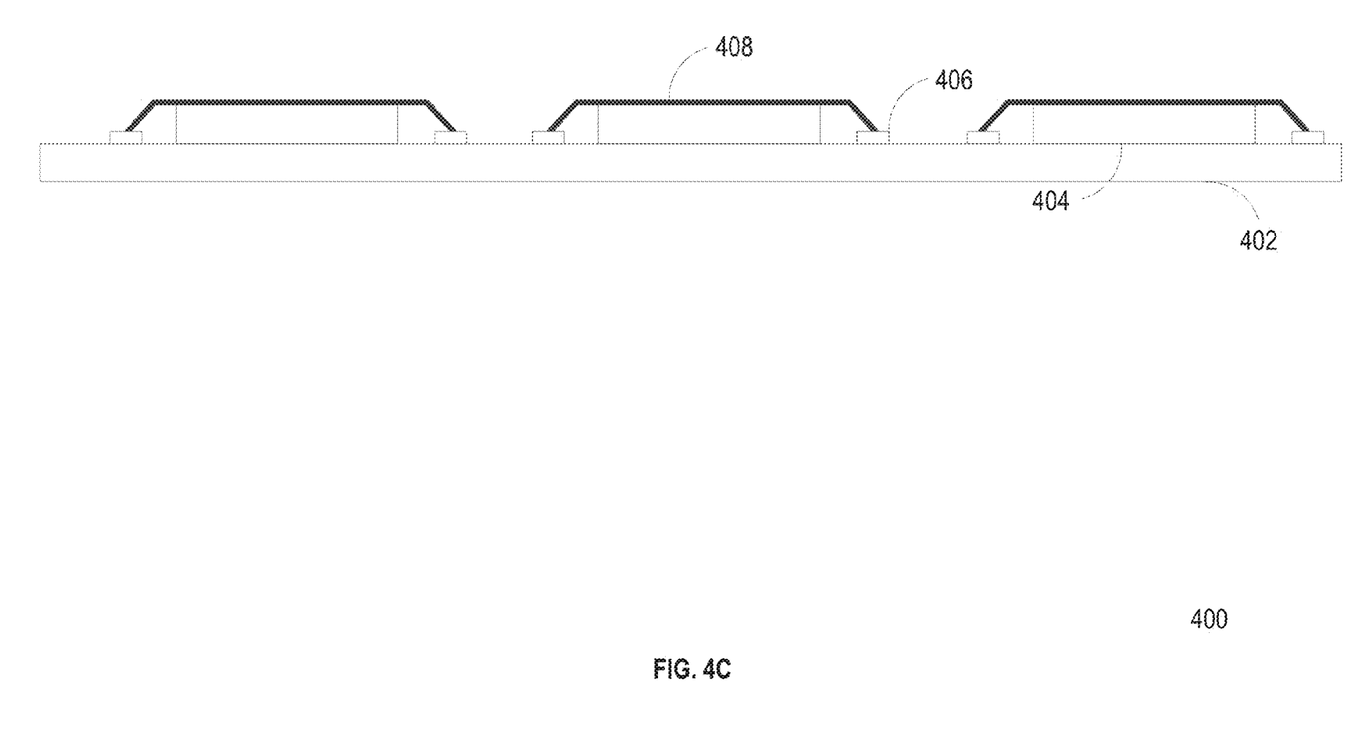

FIG. 4C shows a stage in a process for fabrication of an electric device 400, in accordance with some example embodiments. In some example embodiments, the electric device 400 is a system in a package. FIG. 4C continues the process shown in FIGS. 4A and 4B.

In this example, the perforated conductive material 408 has been securely attached to the one or more grounding pads 406. In this way, each device 404 that is connected to the substrate 402 has a layer of perforated conductive material 408 covering it to shield it from electromagnetic interference.

Figure 4D:
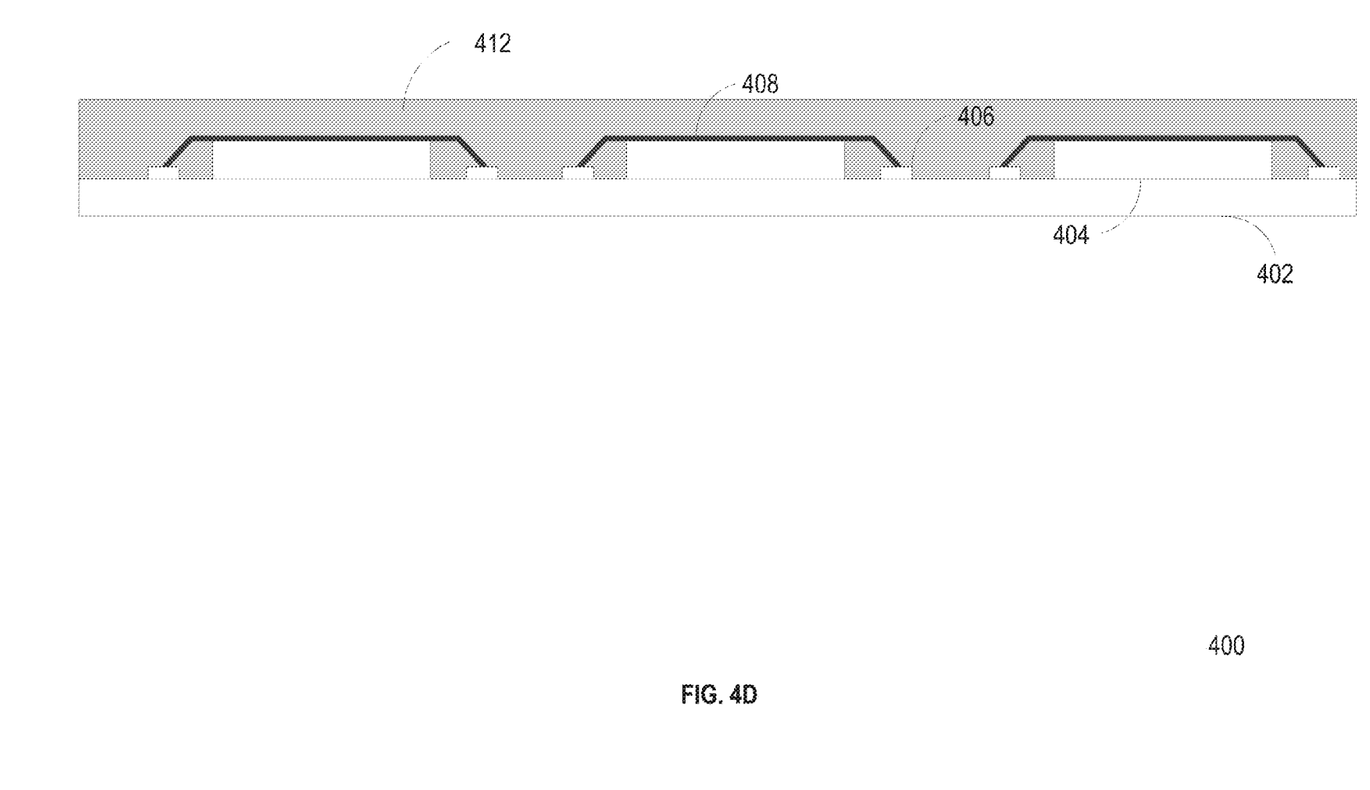

FIG. 4D shows a stage in a process for fabrication of an electric device 400, in accordance with some example embodiments. In some example embodiments, the electric device 400 is a system in a package (SiP). FIG. 4D continues the process shown in FIGS. 4A-4C.

In this example, the perforated conductive material 408, devices 404, grounding pads 406, and substrate 402 have all been covered by a layer of molding compound 412. In some example embodiments, placing the perforated conductive material 408 before depositing the molding compound 412 allows the perforated conductive material 408 to be as close as possible to the device 404 for which it serves as an EMI shield.

Figure 4E:
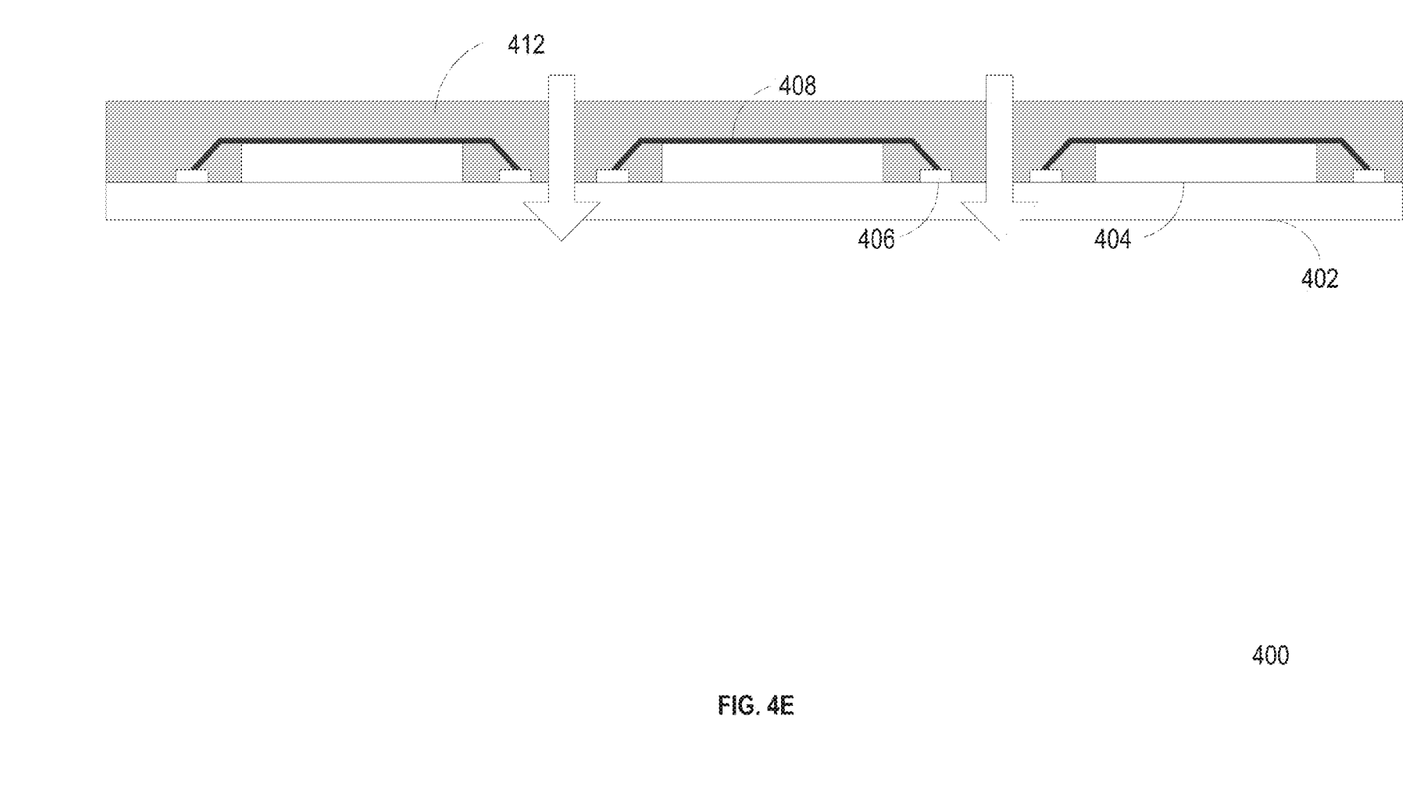

FIG. 4E shows a stage in a process for fabrication of an electric device 400, in accordance with some example embodiments. In some example embodiments, the electric device 400 is a system in a package. FIG. 4E continues the process shown in FIGS. 4A-4D.

In some example embodiments, the substrate 402 is divided or cut into a plurality of individual SiPs. In this example, each individual SiP includes a single device 404, the substrate 402 section to which the device 404 is attached, one or more grounding pads 406, the associated perforated conductive material 408, and molding compound 412. In some example embodiments, the substrate 402 is divided using a saw or other cutting tool.

Figure 5:
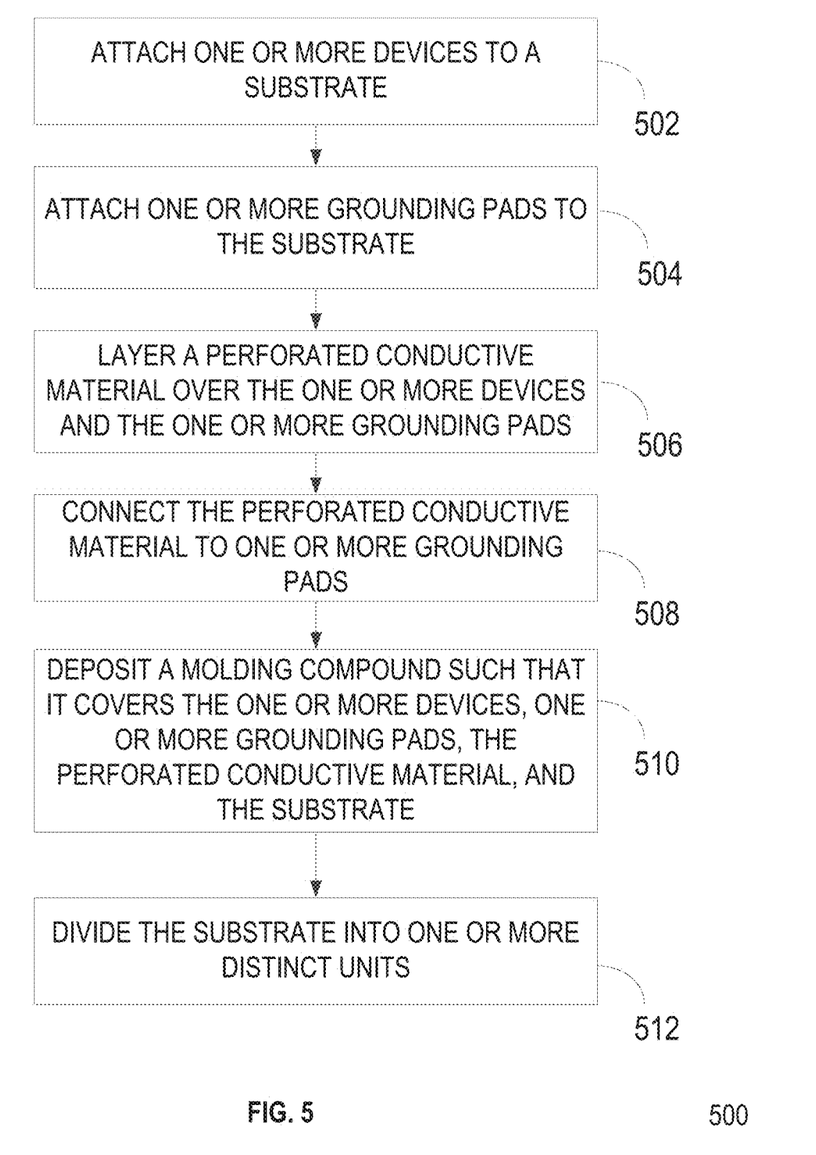
FIG. 5 is a flow diagram illustrating a method, in accordance with some example embodiments, for using a perforated conductive material to shield semiconductor devices and components from electromagnetic interference.

FIG. 5 is a flow diagram 500 illustrating a method, in accordance with some example embodiments, for using a perforated conductive material to shield semiconductor devices and components from electromagnetic interference. In some embodiments, the method described in FIG. 5 is performed during the manufacturing of an electric device (e.g., the device 100 in FIG. 1). The method described can also be performed by any other suitable configuration of hardware.

In some example embodiments, one or more devices are attached (502) to a substrate. In some example embodiments, the devices include any electric devices such as processors, memory devices, and so on. In some example embodiments, the substrate is an organic substrate.

In some example embodiments, one or more grounding pads are attached (504) to the substrate. The grounding pads are sections of conductive material that connect to electrical ground. In this way, unwanted or problematic electric charge can be disposed of. In some example embodiments, the grounding pads connect through the substrate to a ground pad on the other side of the substrate.

A perforated conductive material is layered (506) over the one or more devices and the one or more grounding pads. As noted above, the perforated conductive material can include but is not limited to metal tape or ribbon, perforated metal foil, porous copper foam material, and metal mesh or weave. The perforated conductive material is then connected (508) to the one or more grounding pads such that the perforated conductive material covers the one or more devices.

A molding compound is deposited (510) such that the molding compound layer covers the one or more devices, the one or more grounding pads, the perforated conductive material, and the substrate. The substrate is then divided (512) into one or more distinct units.

Figure 6:
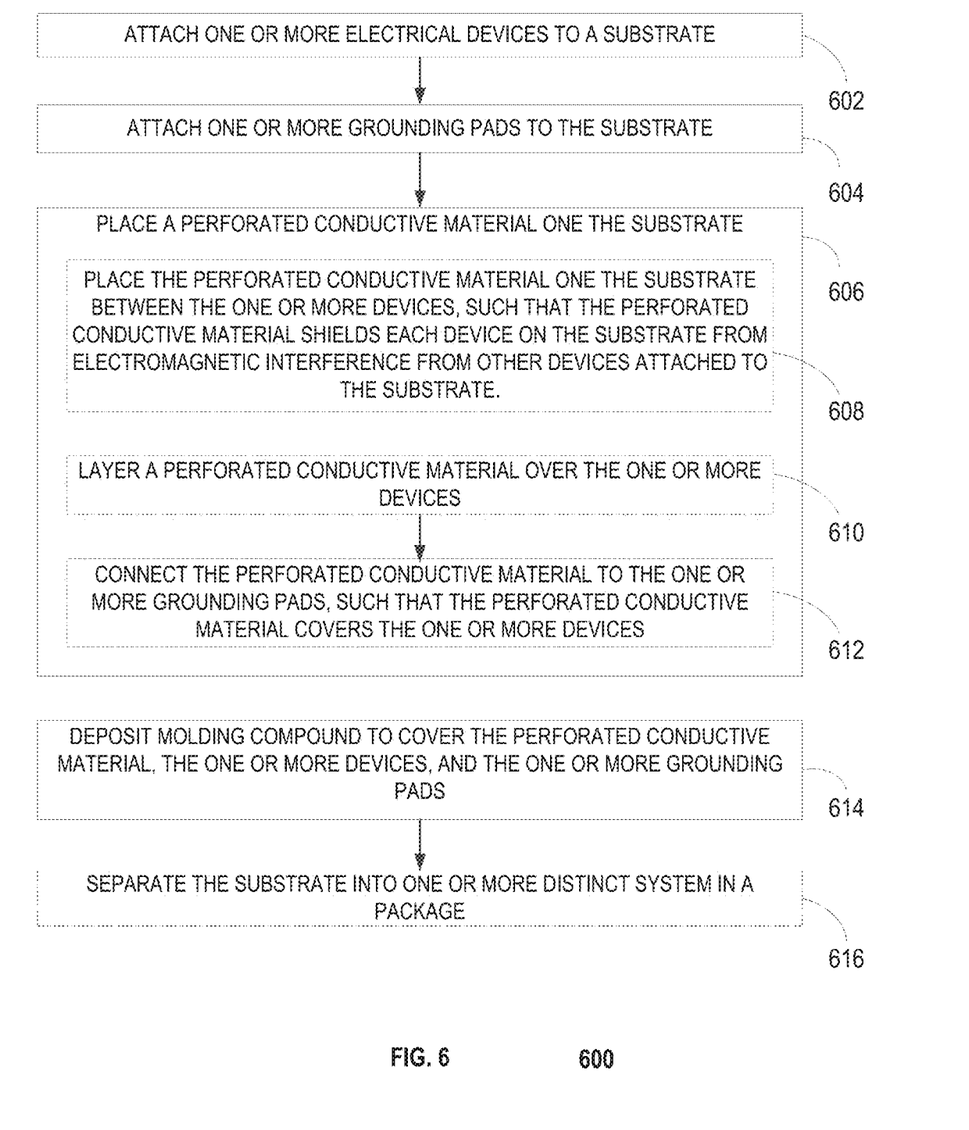
FIG. 6 is a flow diagram illustrating a method, in accordance with some example embodiments, for using a perforated conductive material to shield semiconductor devices and components from electromagnetic interference.

FIG. 6 is a flow diagram illustrating a method, in accordance with some example embodiments, for using a perforated conductive material to shield semiconductor devices and components from electromagnetic interference. Each of the operations shown in FIG. 6 may correspond to instructions stored in a computer memory or computer-readable storage medium. Optional operations are indicated by dashed lines (e.g., boxes with dashed-line borders). In some embodiments, the method described in FIG. 6 is performed during the manufacturing of an electrical device (e.g., the device 100 in FIG. 1). The method described can also be performed by any other suitable configuration of hardware.

In some example embodiments, one or more electrical devices are attached (602) to a substrate. In some example embodiments, the one or more electrical devices include a processor. In some example embodiments, the one or more electrical devices include a memory device, such as NAND flash memory.

In some example embodiments, one or more grounding pads are attached to the substrate. In some example embodiments, the one or more grounding pads included conductive material that connects to electric ground. For example, the one or more grounding pads connect to a ground pad. In some example embodiments, the ground pad is located on the bottom of the substrate and thus, the grounding pads need to be connected electrically through the substrate to the bottom side.

In some example embodiments, a perforated conductive material is placed (606) on the substrate. In some example embodiments, placing a perforated conductive material on the substrate includes placing (608) the perforated conductive material one the substrate between the one or more devices, such that the perforated conductive material shields each device on the substrate from electromagnetic interference from other devices attached to the substrate.

In some example embodiments, the perforated conductive material is physically affixed to one or more grounding pads via solder, paste, or other connective material. In some example embodiments, the perforated conductive material is a metal ribbon.

In other example embodiments, placing a perforated conductive material one the substrate further comprises layering a perforated conductive material over the one or more devices. For example, a metal mesh is laid over the substrate and attached devices, such that all the devices are covered.

In some example embodiments, the perforated conductive material is connected (612) to the one or more grounding pads, such that the perforated conductive material covers the one or more devices.

In some example embodiments, the perforated conductive material is perforated metal foil. In other example embodiments, the perforated conductive material is porous copper foam material. In some example embodiments, the perforated conductive material is metal mesh.

In some example embodiments, molding compound is deposited (614) to cover the perforated conductive material, the one or more devices, and the one or more grounding pads.

In some example embodiments, the substrate (or substrate strip) is separated (616) into one or more distinct system in a package. In some example embodiments, the substrate is separated (or singulated) using specialized saw technology.

Figure 7:
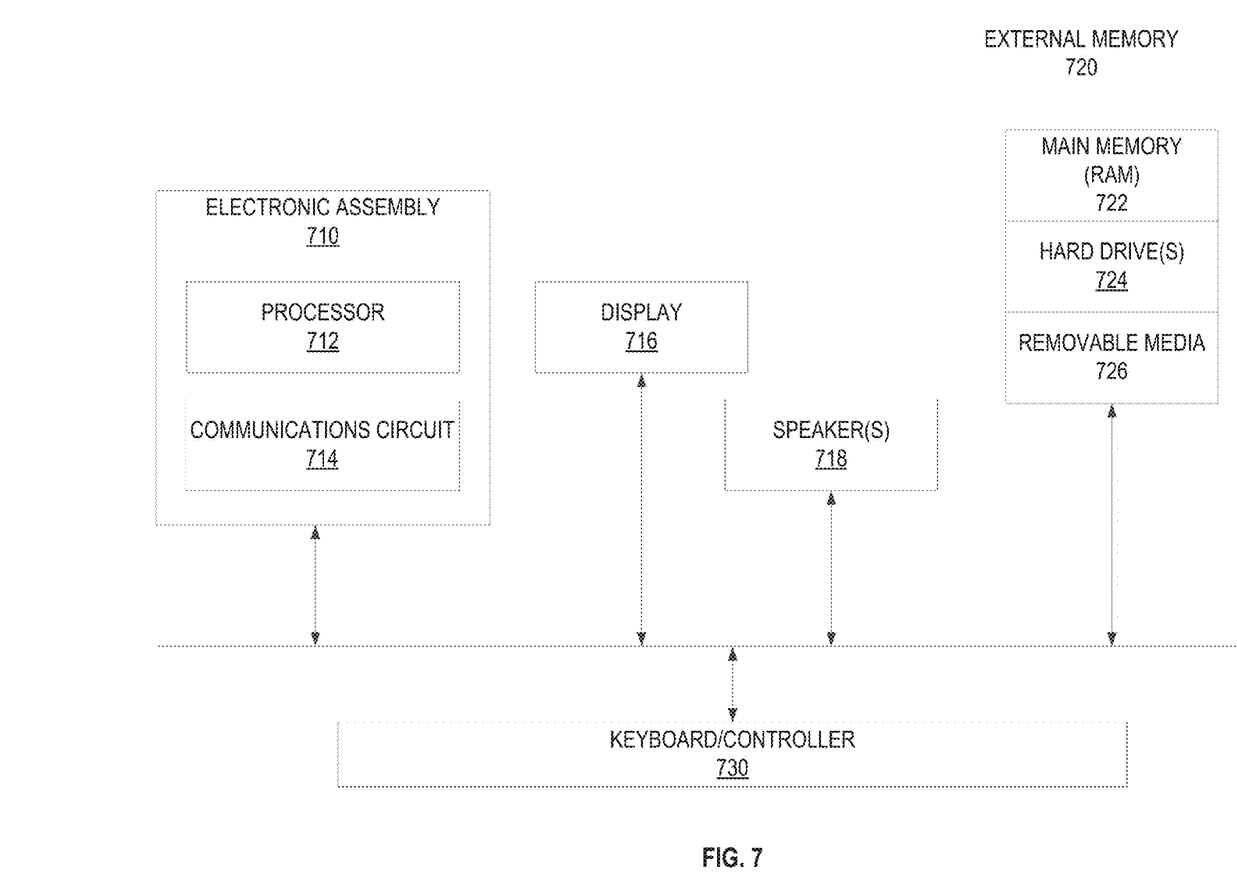
FIG. 7 is a block diagram of an electronic device incorporating at least one device and/or method in accordance with at least one disclosed example embodiment.

An example of an electronic device using semiconductor chip assemblies as described in the present disclosure is included to show an example of a higher level device application for the described embodiments. FIG. 7 is a block diagram of an electronic device 700 incorporating at least one device and/or method in accordance with at least one disclosed example embodiment. Electronic device 700 is merely one example of an electronic system in which example embodiments can be used. Examples of electronic devices 700 include, but are not limited to personal computers, tablet computers, mobile telephones, game devices, MP3 or other digital music players, etc. In this example, electronic device 700 comprises a data processing system that includes a system bus 702 to couple the various components of the system. System bus 702 provides communications links among the various components of the electronic device 700 and can be implemented as a single bus, as a combination of busses, or in any other suitable manner.

An electronic assembly 710 is coupled to system bus 702. The electronic assembly 710 can include any circuit or combination of circuits. In one embodiment, the electronic assembly 710 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 710 are a custom circuit, an application-specific integrated circuit (ASIC), or the like, such as, for example, one or more circuits (such as a communications circuit 714) for use in wireless devices like mobile telephones, personal data assistants, portable computers, two-way radios, and similar electronic systems. The IC can perform any other type of function.

The electronic device 700 can also include an external memory 720, which in turn can include one or more memory elements suitable to the particular application, such as a main memory 722 in the form of random access memory (RAM), one or more hard drives 724, and/or one or more drives that handle removable media 726 such as compact disks (CD), flash memory cards, digital video disk (DVD), and the like.

The electronic device 700 can also include a display device 716, one or more speakers 718, and a keyboard and/or controller 730, which can include a mouse, trackball, touch screen, voice-recognition device, or any other device that permits a system user to input information into and receive information from the electronic device 700.

TERM USAGE

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. An electrical device, comprising:
   one or more electrical devices attached to a substrate;
   one or more grounding pads attached to the substrate;
   a perforated conductive material placed on the substrate, wherein the perforated conductive material is one of a metal foil with a plurality of holes, a porous copper foam material, and a metal mesh and wherein the perforated conductive material allows a molding compound to pass through; and
   wherein the molding compound deposited over and through the perforated conductive material to cover the perforated conductive material, the one or more devices under the perforated conductive material, and the one or more grounding pads.

2. The device of claim 1, wherein the one or more electrical devices include a processor.

3. The device of claim 1, wherein the one or more electrical devices include a memory device.

4. The device of claim 1, wherein the one or more grounding pads includes conductive material that connects to electric ground.

5. The device of claim 1, wherein the perforated conductive material is layered over the one or more devices; and
the perforated conductive material is connected to the one or more grounding pads, such that the perforated conductive material covers the one or more devices.

6. The device of claim 1, wherein the perforated conductive material is placed on the substrate between the one or more devices, such that the perforated conductive material shields each device on the substrate from electromagnetic interference from other devices attached to the substrate.

7. The device of claim 6, wherein the perforated conductive material is a metal ribbon.

8. A method, comprising:
attaching one or more electrical devices to a substrate;
attaching one or more grounding pads to the substrate;
placing a perforated conductive material on the substrate, wherein the perforated conductive material is one of a metal foil with a plurality of holes, a porous copper foam material, and a metal mesh and wherein the perforated conductive material allows a molding compound to pass through; and
depositing the molding compound over and through the perforated conductive material to cover the perforated conductive material, the one or more devices under the perforated conductive material, and the one or more grounding pads.

9. The method of claim 8, wherein attaching one or more electrical devices to the substrate includes attaching a processor.

10. The method of claim 8, wherein attaching one or more electrical devices to the substrate includes attaching a memory device.

11. The method of claim 8, wherein the one or more grounding pads included conductive material that connects to electric ground.

12. The method of claim 8, wherein placing a perforated conductive material on the substrate further comprises:
layering a perforated conductive material over the one or more devices; and
connecting the perforated conductive material to the one or more grounding pads, such that the perforated conductive material covers the one or more devices.

13. The method of claim 8, wherein placing a perforated conductive material on the substrate further comprises:
placing the perforated conductive material on the substrate between the one or more devices, such that the perforated conductive material shields each device on the substrate from electromagnetic interference from other devices attached to the substrate.

14. The method of claim 13, wherein placing a perforated conductive material includes placing a metal ribbon.

15. The method of claim 8, wherein placing a perforated conductive material includes placing a perforated metal foil.

16. The method of claim 8, wherein placing a perforated conductive material includes placing a porous copper foam material.

17. The method of claim 8, wherein placing a perforated conductive material includes placing a metal mesh.

18. The method of claim 8, wherein the perforated conductive material is nonconductive material with a metallization coating.

19. The electric device of claim 8, further comprising:
separating the substrate into one or more distinct systems in a package.

20. A non-transitory computer readable storage medium storing one or more programs for execution by one or more processors, the one or more programs comprising instructions for:
attaching one or more electrical devices to a substrate;
attaching one or more grounding pads to the substrate;
placing a perforated conductive material on the substrate, wherein the perforated conductive material is one of a metal foil with a plurality of holes, a porous copper foam material, and a metal mesh and wherein the perforated conductive material allows a molding compound to pass through; and
depositing the molding compound over and through the perforated conductive material to cover the perforated conductive material, the one or more devices under the perforated conductive material, and the one or more grounding pads.

* * * * *

UNITED STATES PATENT AND TRADEMARK OFFICE
CERTIFICATE OF CORRECTION

| | |
|---|---|
| PATENT NO. | : 9,704,811 B1 |
| APPLICATION NO. | : 14/978294 |
| DATED | : July 11, 2017 |
| INVENTOR(S) | : Dias et al. |

It is certified that error appears in the above-identified patent and that said Letters Patent is hereby corrected as shown below:

On the Title Page

In item (22), in "Filed", in Column 1, Line 1, after "Dec. 22, 2015", insert:
--¶(65) Prior Publication Data
US 2017/0179040 A1 Jun. 22, 2017--

Signed and Sealed this
Thirtieth Day of October, 2018

Andrei Iancu
*Director of the United States Patent and Trademark Office*